United States Patent
Suzuki et al.

(10) Patent No.: US 6,249,062 B1
(45) Date of Patent: Jun. 19, 2001

(54) METHOD AND APPARATUS OF PSEUDOGROUNDING

(75) Inventors: Mitsuo Suzuki; Kenji Kohya; Masaru Deguchi, all of Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/296,234

(22) Filed: Apr. 22, 1999

(30) Foreign Application Priority Data

Apr. 24, 1998 (JP) .................................................. 10-131453

(51) Int. Cl.$^7$ ...................................................... H04B 3/28
(52) U.S. Cl. ................................ 307/89; 320/30; 333/18; 361/818; 369/107
(58) Field of Search .............................. 307/89; 327/333; 333/165, 181; 315/85; 320/30; 301/818; 257/659; 369/107

(56) References Cited

U.S. PATENT DOCUMENTS

| | | | |
|---|---|---|---|
| 4,274,050 | * 6/1981 | Martin | 327/333 |
| 4,760,231 | 7/1988 | Hayashi . | |
| 4,908,735 | 3/1990 | Tsuneki . | |
| 5,488,540 | * 1/1996 | Hatta | 333/165 |
| 5,589,718 | * 12/1996 | Lee | 307/72 |
| 5,757,338 | * 5/1998 | Bassetti et al. | 315/85 |
| 5,841,202 | 11/1998 | Noguchi et al. . | |
| 6,008,682 | * 12/1999 | Mirov | 326/30 |

FOREIGN PATENT DOCUMENTS

| | | |
|---|---|---|
| 0 181 286 A1 | 5/1986 | (EP) . |
| 0 673 057 A2 | 9/1995 | (EP) . |
| 61-212193 | 9/1986 | (JP) . |
| 63-107195 | 5/1988 | (JP) . |
| 6-2786 | 1/1994 | (JP) . |
| 6-85485 | 3/1994 | (JP) . |
| 06-098539 | 4/1994 | (JP) . |
| 6-252575 | 9/1994 | (JP) . |
| 9-312488 | 12/1997 | (JP) . |
| 10-22857 | 1/1998 | (JP) . |

* cited by examiner

*Primary Examiner*—Albert W. Paladini
(74) *Attorney, Agent, or Firm*—Foley & Lardner

(57) ABSTRACT

To provide a method of pseudogrounding which is capable of protecting against EMI by pseudogrounding communication lines, etc. without necessity of expensive ferrite cores and increasing the number of steps and cost. A wiring which is connected to an LSI (43) on a package and is connected to an external wiring (47) via a connector (461), radio-frequency connected via a capacitance (451, 452) to ta housing (42) in which protection against EMI is achieved so that the radiated noise energy is not higher than EMI restricted value level. This enables said wiring to be pseudo-grounded.

15 Claims, 8 Drawing Sheets

GROUND (SURFACE OF THE EARTH)

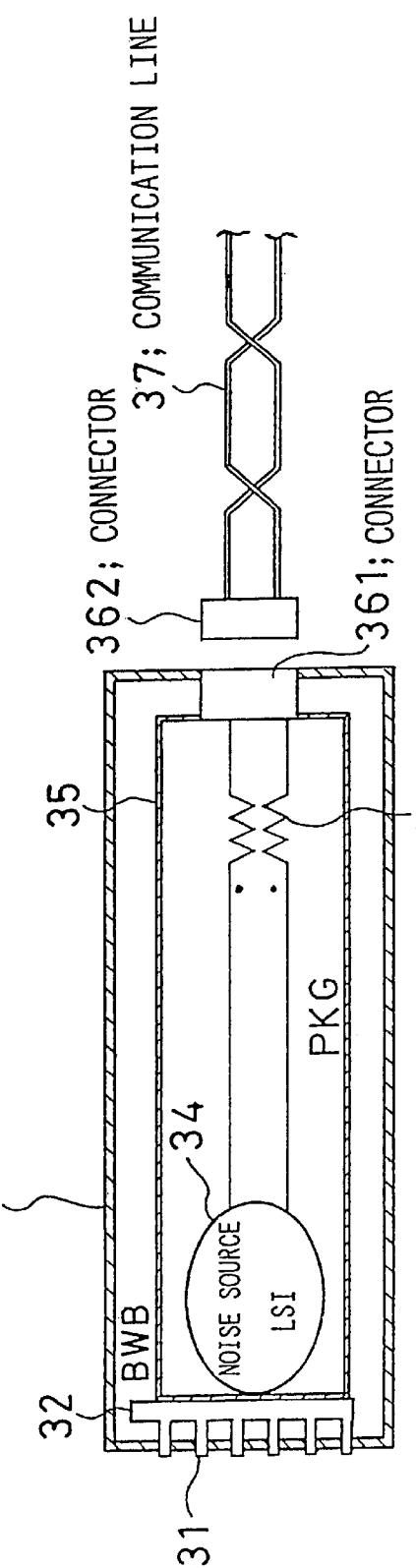
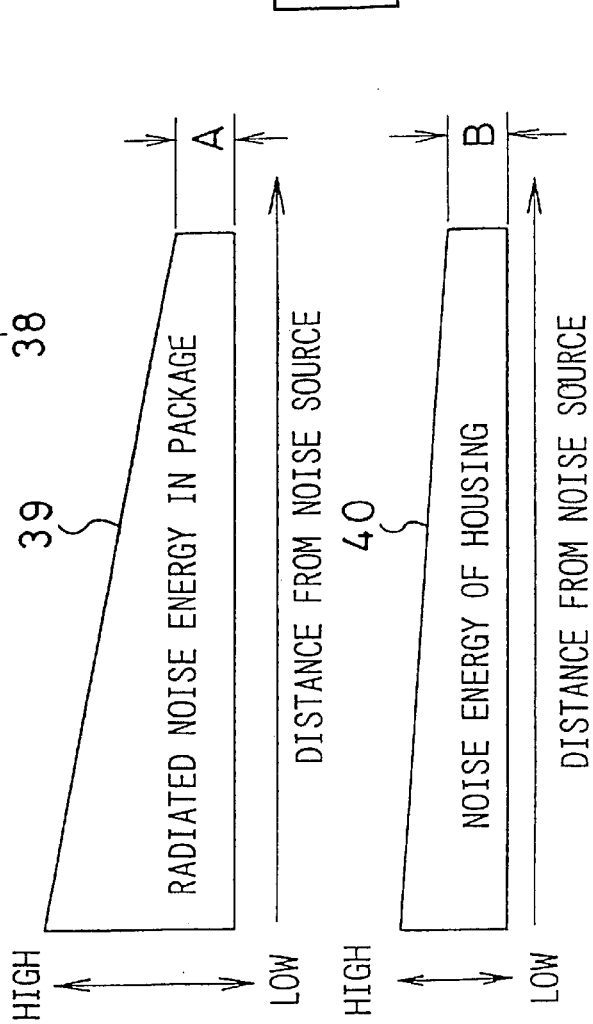
FIG. 3(a)
FIG. 3(b)
FIG. 3(c)

(a)

(b)

METHOD AND APPARATUS OF PSEUDOGROUNDING

FIELD OF THE INVENTION

The present invention relates to a technique for protecting an electronic device from electromagnetic interference (EMI), and in particular to a method and apparatus for pseudogrounding an electronic device which is connected to a plurality of cables such as communication lines, power supply lines, and interface buses.

BACKGROUND

For corporate information communication devices such as switches for PBX (private branch exchange), ATM (asynchronous transfer mode) switches, etc. which are connected to a number of communication lines, such as telephone lines of unshielded twisted pair cables which are wired simultaneously with construction of building, it is generally impossible to replace all existing indoor wires with new shielded wires which are employed for information devices such as personal computers and main frames, etc.

SUMMARY OF THE DISCLOSURE

Accordingly, protection against EMI was endeavored by passing communication lines, interface lines or power supply lines through apertured ferrite cores. However, cost for preventing EMI is tremendously high due to use of a lot of expensive ferrite cores.

Since the standards of measurement which are specified by CISPR22, VCCI is added with an additional requirement that the packages and cables should be added until no increase in measured radiated noise by 2 dB or more occurs when the number of packages and cables is increased in case where a plurality of packages and cables are incorporated in a device under test, a measurement should be conducted in a system in which a maximum number of packages and cables are accommodated. A stable protection against EMI, in which the energy of the radiated noise never increase even if the number of packages and cables is increased has been demanded.

The present invention has been thus achieved in view of the above-mentioned problem. It is an object of the present invention to provide a method and apparatus for protecting an electronic device from EMI at a low expenditure without using any expensive ferrite cores, particularly those which achieve reduction in the number of steps for EMI protection and in cost therefor.

It is a further object of the present invention to provide a novel method and apparatus which is capable of pseudo-grounding communication lines, etc.

In order to achieve the above-mentioned object, there is provided a method for protecting against EMI, according to a first aspect of the present invention. In the method, a wiring is pseudogrounded by radio-frequency connecting said wiring having a level of the radiated noise energy which is reduced to a value less than that of a pseudogrounded housing to said housing via a capacitance.

In a method according to a second aspect of the present invention, a wiring is pseudogrounded (a) by making the level of the radiated noise energy of a package which is accommodated in a pseudogrounded housing less than that of said housing, and (b) by radio-frequency connecting said wiring connected to a circuit block on said package and connected to an external wiring via a connector to said pseudogrounded housing via a capacitive element.

According to a third aspect of the present invention, there is provided a structure, wherein a wiring that is connected to an integrated circuit block on a package to be accommodated in a housing, and is connected to an external wiring via a connector is radio-frequency connected to a pseudogrounded housing (particularly pseudogrounded earth position) via a capacitive element in said package.

BRIEF DESCRIPTION OF THE DRAWINGS

FIG. 3 is a view explaining a mode of embodying the present invention, FIG. 3(*a*) is an elevational and sectional view of a housing, FIGS. 3(*b*) and 3(*c*) are views showing the characteristics of the radiated noise energy in a package and on the housing, respectively.

PREFERRED EMBODIMENTS OF THE INVENTION

Figure 1:
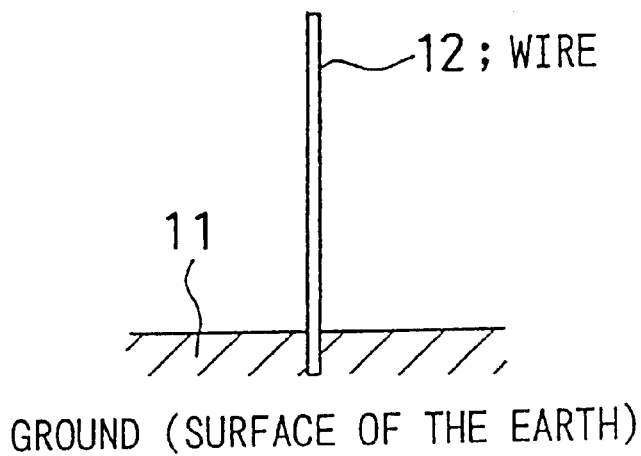
FIG. 1 is a view explaining the principle of the present invention.

A mode of embodying the present invention will be described. In a preferred embodiment of the present invention, a wiring is pseudogrounded by radio-frequency connecting the wire (47 in FIG. 4) connected to an integrated circuit block of a package to be accommodated in a housing and connected to an external wiring via a connector (461, 461 in FIG. 4) to a housing having a radiated noise energy which is reduced to the EMI restricted value or less (pseudogrounded housing) via a capacitance (451,452 in FIG. 4); to equalize the radiated noise energy (49 in FIG. 4) of the package which is protected against EMI so that the radiated noise energy is less than the radiated noise energy (50 in FIG. 4) of said pseudogrounded housing to the radiated noise energy of the pseudo-grounded housing via the capacitance.

Figure 10:
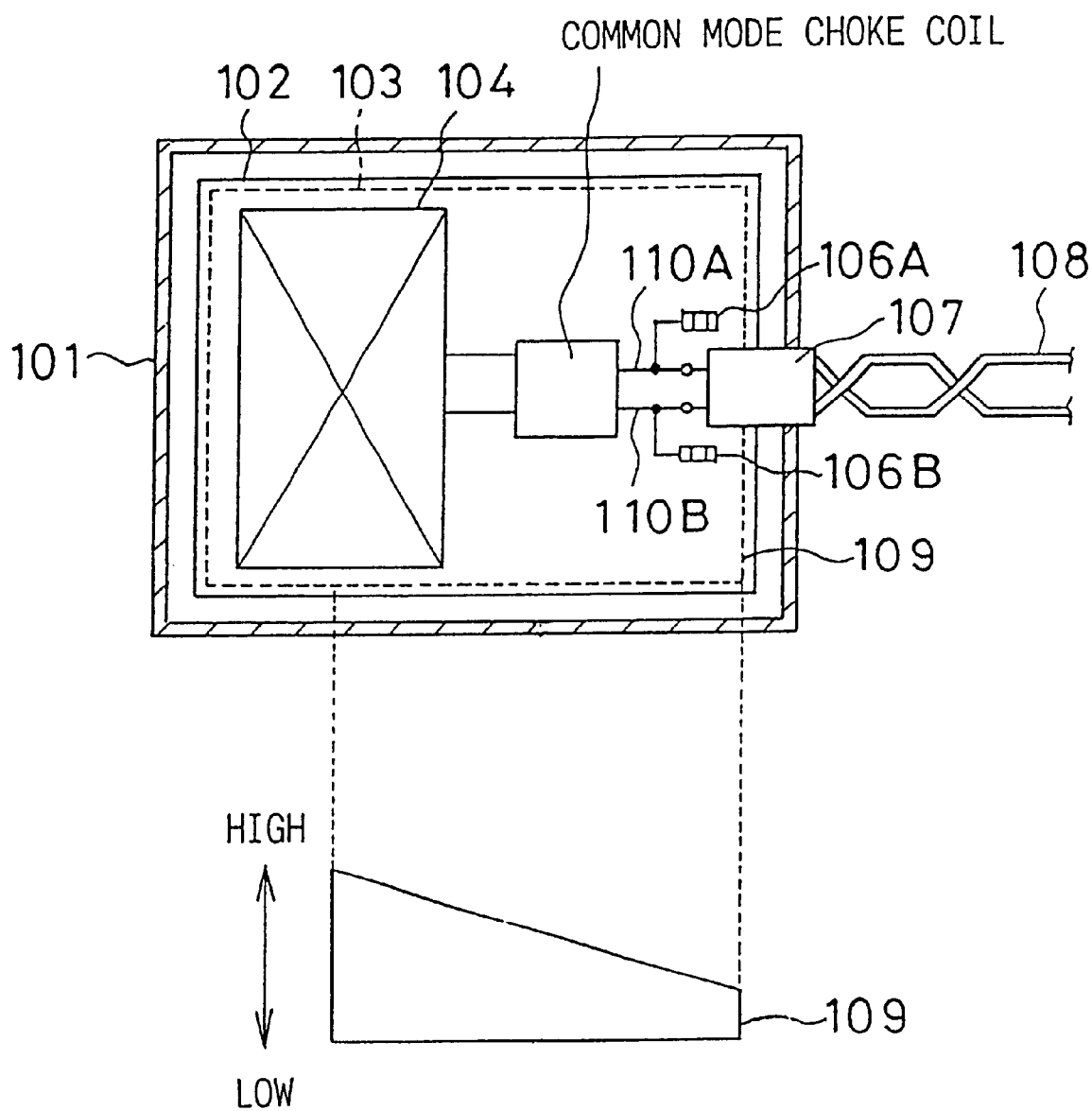
FIG. 10 is a view showing a second embodiment of the present invention.

In a preferred embodiment of the present invention, a wiring may be pseudogrounded by high frequency-connecting the wiring (110A, 110B in FIG. 10), connected to a circuit block (104 in FIG. 10), on said package accommodated in a molded housing and connected to an external wiring (108 in FIG. 10) via a connector, to a given pseudo-grounded earth position on the package via a capacitive element (106A, 106B in FIG. 10)

Figure 11:
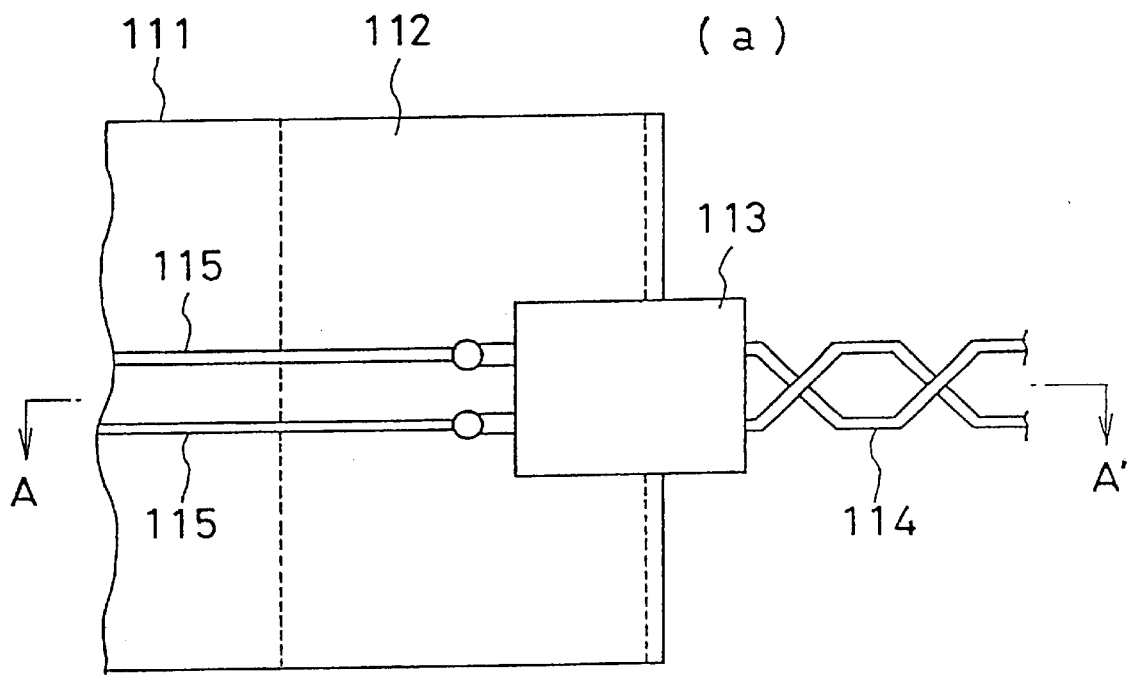
FIGS. 11(*a*) and 11(*b*) are views showing a third embodiment of the present invention.
Figure 11:
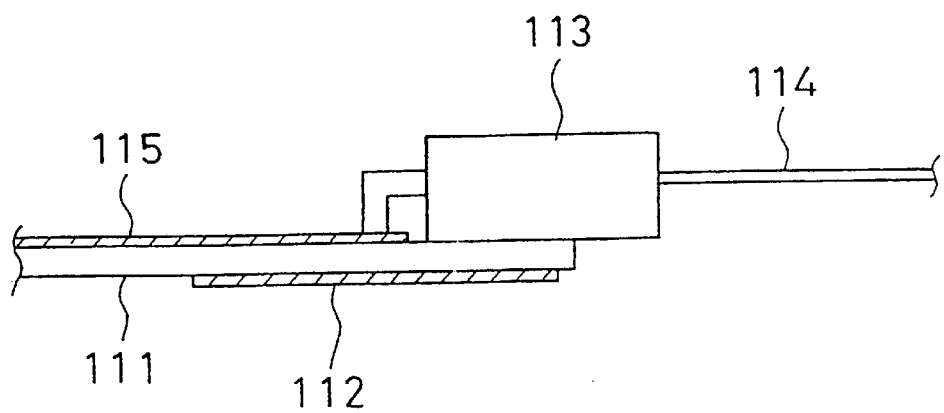

In a preferred embodiment of the invention, a package to be accommodated in a housing may have a substrate, the substrate comprising, a wiring pattern layer (115 in FIG. 11) which is connected to a circuit block and is connected to an external wiring (114 in FIG. 11) via a connector (113 in FIG. 11); and a pattern layer (112 in FIG. 11) which is connected to a pseudogrounded earth position on the package; and the wiring pattern may be pseudogrounded by radio-frequency connecting the wiring pattern layer to the pseudo-grounded earth position via an interlayer capacitance.

Now, the principle of the present invention will be described with reference to the drawings.

If a wire 12 is buried in a hole which is formed in the ground 11 of the earth as shown in FIG. 1, no electromagnetic waves are radiated from the wire 12.

Figure 2:
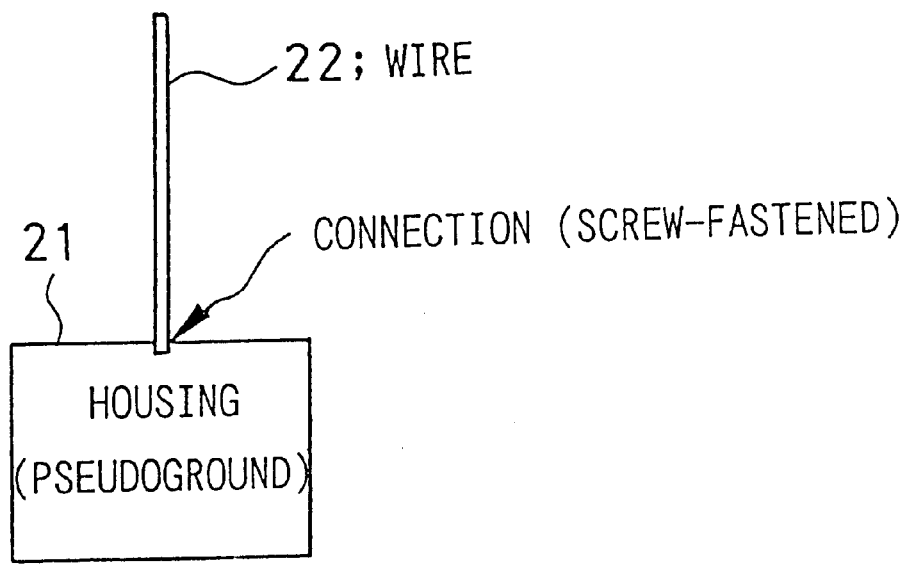
FIG. 2 is a view explaining the principle of the present invention.

A housing 21 in which the level of the radiated noise energy is reduced to the level of the restricted EMI or less as shown in FIG. 2 can be considered as a pseudoground. No electromagnetic waves are radiated from the wire 22 which is screwed to the pseudogrounded housing 21.

Figure 6:
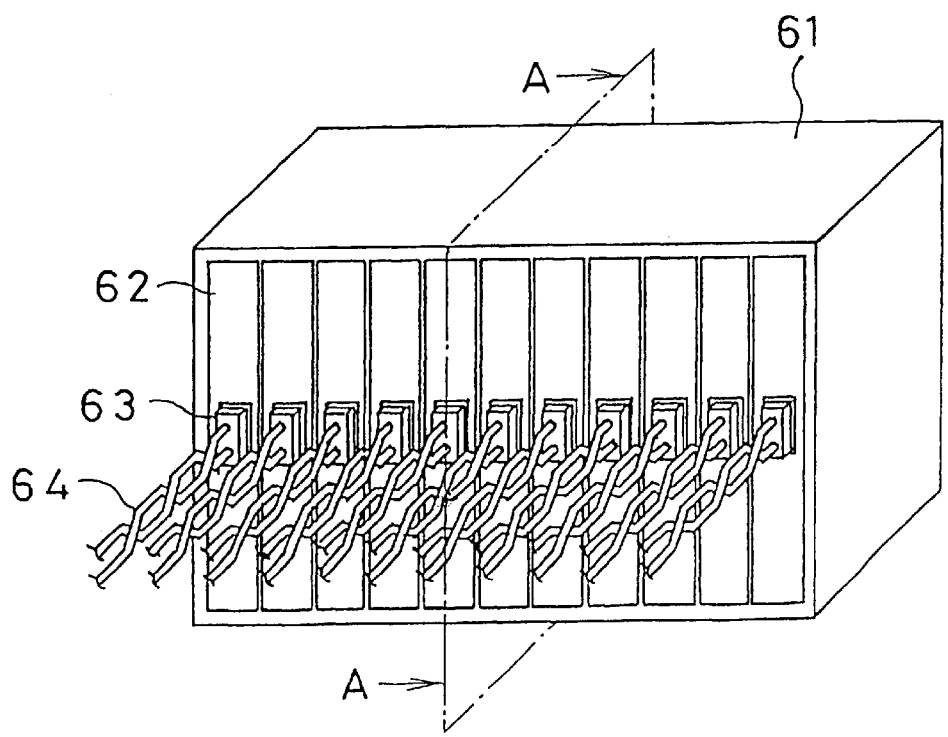
FIG. 6 is a A perspective view showing the appearance of a housing of the embodiment of the present invention.

FIG. 6 is a perspective view showing the appearance of an embodiment of the housing to which the present invention is applied. Refer ring now to FIG. 6, energy of the noise radiated from the housing 61 is reduced by closing gaps in a housing 61 and by determining the dimensions of heat radiating holes according to Quine's formula and the intervals of screw pitches according to the theory of wave guide. All communication functional packages with metallic front plates 61 are loaded in the housing 61, and communication lines 64 and connectors 63 are removed from the housing 61. The communication lines are screwed to upper and lower screws of the metallic front plates 62. This condition is schematically illustrated in FIG. 8.

Figure 8:
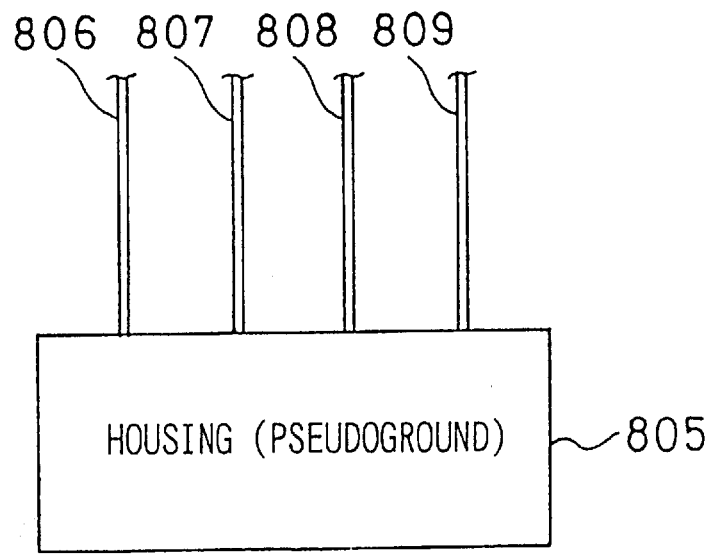
FIG. 8 is a view showing a mode of embodying the present invention.

Any communication lines 806, power supply lines 807, interface lines 808 and other lines 809 leading from the housing 805 accommodating all packages therein are screwed to the housing 805 as shown in FIG. 8.

If the energy of the radiated noise is not higher than the EMI restricted value under this condition, this housing 805 will serve as a pseudogrounded housing.

If all the communication lines 806, power supply line 807, interface line 808 and the other line 809 are removed from the housing 805 by unscrewing and the communication line circuit in which the level of the hoise energy is reduced to a level of the noise radiated from the pseudogrounded housing or less is radio-frequency connected with the pseudogrounded housing within the package (35 in FIG. 3) having a communication circuit and the like, no increase in the noise energy of the pseudogrounded housing would be occur.

FIG. 3 is a view illustrating the mode of embodying the present invention. FIG. 3a is a view schematically showing the structure of the housing and package. FIGS. 3(b) and 3(c) are views showing the characteristics of the radiated noise energy of the housing and packages, respectively.

In FIG. 3, the noise energy 40 of the pseudogrounded housing 33 assumes a minimum value B in the vicinity of a connector 361. A communication line 37 is representative of all communication lines, power supply lines, interface lines leading from the pseudogrounded housing 33.

Referring now to FIG. 3, the energy from an LSI 34 which is a noise source in the communication line circuit which is inserted into a BWB (backboard) 32 is reduced by means of a noise reducing component such as common mode choke coil 38 and the like so that the radiated noise energy 39 in the package is reduced to a level A at the communication line connector. In other words, the radiated noise energy is reduced in the package 35 until the radiated noise energy A of the connector 361 for the communication line circuit is reduced to a level or less of the noise energy B of the pseudogrounded housing 33 or less.

Figure 4:
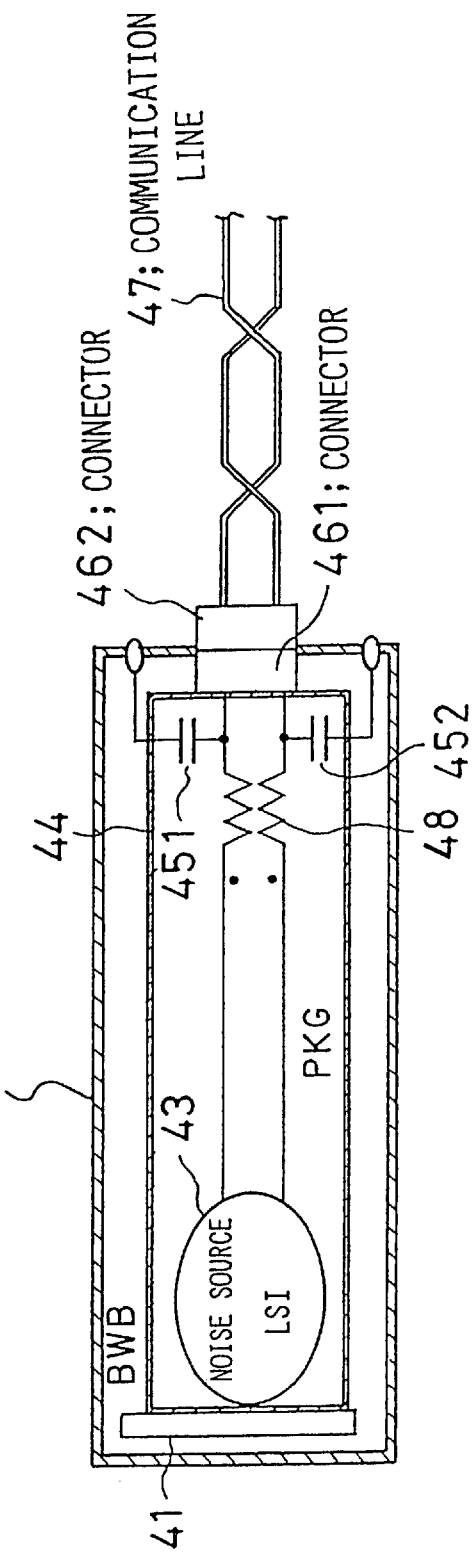
FIG. 4 is a view explaining another mode of embodying the present invention, FIG. 4(*a*) is an elevational and sectional view of a housing, FIG. 4(*b*) is a view showing the characteristics of the radiated noise energy in a package and on the housing.
Figure 4:
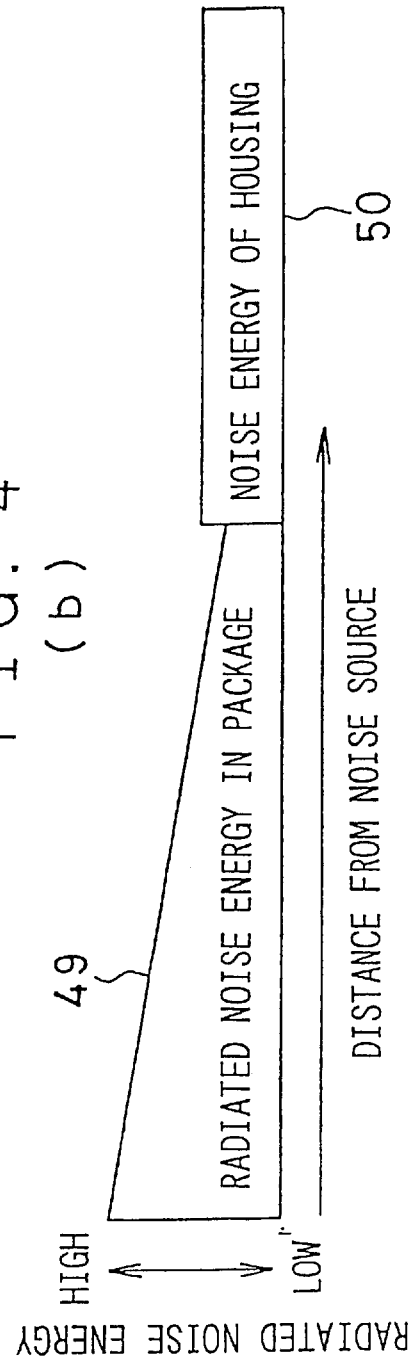

The communication lines 47 can be also pseudogrounded to comply the EMI restriction by radio-frequency connecting a communication line wiring pattern (section) between the common mode choke coil 48 of the communication line circuit and the connector 461 to a part of the housing (metallic front plates 62, 76 of the packages in FIGS. 6 and 7, respectively) in the vicinity of the connector 461 of the pseudogrounded housing 42 with the package 44 via capacitors 451, 452 having radio-frequency characteristics as shown in FIG. 4.

Referring to FIG. 4, a step different at in the interface between the radiated noise energy 49 within the package and the noise energy 50 of the housing represents a difference between the energy A and B immediately before the connection of the capacitors 451 and 452 having radio frequency characteristics in the condition shown in FIG. 3.

The energy transfer occurs from the noise energy 50 (level B in FIG. 3(c)) to the radiated noise energy 49 (level A in FIG. 3(b)) within the package after the connection of the capacitors 451, 452 having radio-frequency characteristics, so that the level of the noise energy 50 of the housing is reduced below the level B.

Radio-frequency connection of the communication line having a noise energy level lower than that of the housing with the pseudogrounded housing in such a manner makes the communication line equivalent to the wire 22 buried in the pseudo-grounded housing as shown in FIG. 2.

The radiated noise energy A from the communication line is reduced below that B of the pseudogrounded housing.

The above-mentioned communication line is radio-frequency connected to the pseudogrounded housing.

Figure 5:
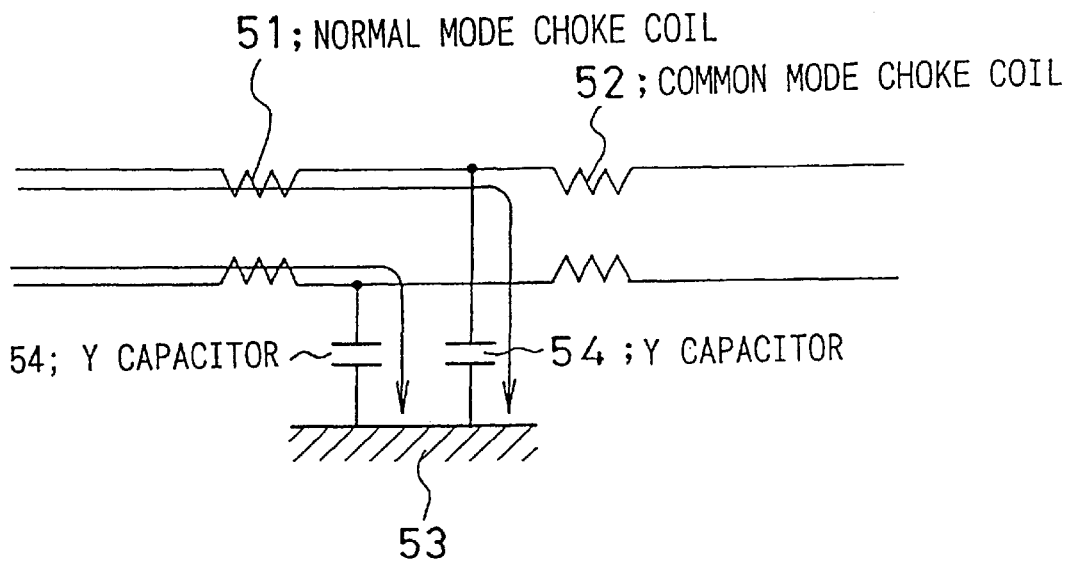
FIG. 5 is a schematic view explaining a prior art method of protecting against EMI as a comparative example.

Now, prior art method will be described for comparison. In the prior art method, the radiated noise energy from the communication line has been reduced, for example, by passing the radiated noise energy from the communication line to the housing 53 via Y capacitor 54 as shown in FIG. 5.

The problem of the prior art resides in that the housing will be contaminated with a noise current flowing from the communication lines into the housing and when the energy of the noise current increases, the housing will serve as an antenna for radiating noise therefrom.

In brief, the metallic housing is a finite pseudoground unlike the earth which is an infinite ground. The amount of the absorbed energy which can be passed to the housing serving as the pseudoground is limited.

This problem will be described in more detail with reference to FIG. 7. The metallic housing 71 is connected with the earth (E) 72 of the BWB via studs 81 at multiple points and is also connected to the earth of the PWB (printed wired board) 73 which is inserted into the backboard, so that all grounds are only one reference ground. Accordingly, a very small radiated noise current may flow on the surface of the housing 71.

If the reduction in the radiated noise energy from the communication lines is insufficient, the radiated noise energy might be passed to the housing. In particular, if protection against EMI is conducted when a plurality (number) of packages are inserted into the housing, high radiated noise currents might flow from the communication. There occurs a problem that the housing may function as an antenna. The efficiency of EMI prevention becomes very low.

In the embodiment of the present invention, the capacitors 451, 452 for radio-frequency connection as shown in FIG. 4 play a role to make a radiated noise energy A of the communication line function package which is protected against EMI so that the energy A is lower than that of the pseudogrounded housing 42 equal to the noise energy B of the pseudogrounded housing 42. This is based upon the theory which is reversal to a scheme that the radiated noise energy from the communication lines is passed to the housing 53 via the Y capacitor 54 in a conventional protection against EMI.

In other words, if the noise from a communication line circuit is for example in a common mode, the common mode noise is reduced by means of the common mode choke coil 38 which is shown in FIG. 3. The radio-frequency connection capacitors (451, 452 in FIG. 4) which are seemed to play a role to bypass the common mode noise to the housing achieve the purpose which is totally opposite to that of the Y capacitor (54 in FIG. 5) for reducing the noise from the communication lines.

If the energy of the radiated noise of the communication lines is lower than that of the housing, it may be considered that the radio-frequency connection capacitors (451, 452 in FIG. 4) are unnecessary. However, these capacitors play an important role.

There are a number of kinds of packages having communication lines for each of a plurality of functions. Although the radiated noise energy of the communication line circuits which are protected against EMI in the packages is generally lower than that of the housing, the levels of the radiated noise energy of the communication lines are of course largely different due to difference in the package kinds and variation in parts.

If there are differences in the radiated noise energy on communication lines after the radiated noise energy has been reduced, radio-frequency currents might flow (like cross talk effect) due to differences in the levels of the radiated noise energy existing among a plurality of communication lines in bundled (and twisted or yarned) cables.

Figure 9:
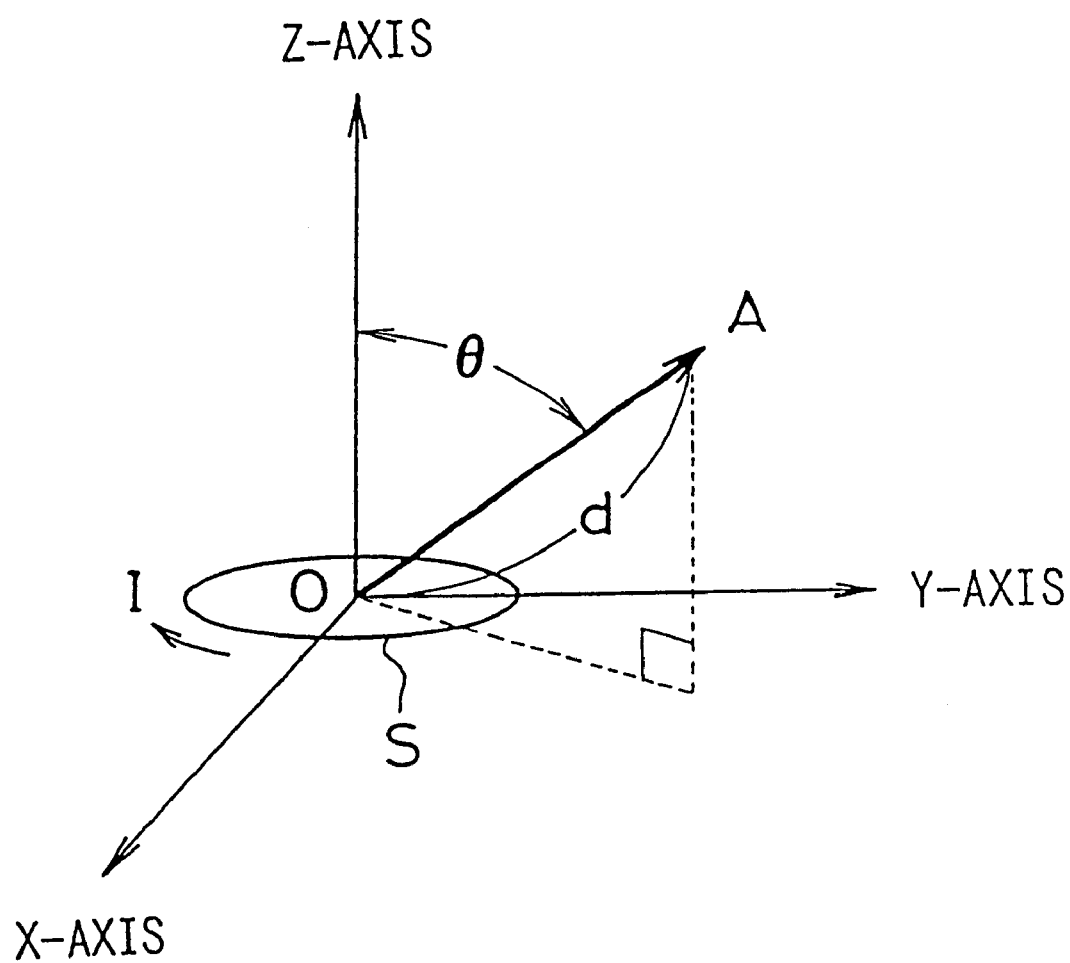
FIG. 9 is a schematic view explaining a mode of embodying the present invention and a view explaining a general formula representing the strength of the electromagnetic waves.

When a current I having a frequency of flows through a current loop having an area S in a X-Y plane in FIG. 9, the strength of the electromagnetic wave E at a point A which is far a distanced from an point 0 which is the center of the X-Y plane and the center of the current loop is generally represented by following formula:

$$E(V/m)=K\times\{S(m^2)\times I(A)\times f^2(Hz)/d(m)\}\times \sin\theta \quad (1)$$

where K is a constant and $\theta$ is an angle between a segment connecting points 0 with A and the Z-axis.

If the loop area S increases even when the current value I remains constant in the formula (1), the strength of the electromagnetic wave increases in proportional to S×I, so that the radiated noise energy increases.

In other words, the value S×I increases, so that the strength of radiated noise electromagnetic waves increases if a large current loop area S is formed by a large length of the cables due to the difference in the energy level among the communication lines of cables even if the current value I is low.

Accordingly, radio-frequency connecting capacitors are necessary for the purpose of equalizing the energy levels of all communication lines in the pseudogrounded housing so that there is no difference in the radiated noise energy among the communication lines if they are bundled as cables.

In the embodiment of the present invention, it is necessary that the position of the radio-frequency connection (451, 452 in FIG. 4) between the pseudogrounded housing and the communication lines be far by a distance from the point A, minimizing the strength E represented in FIG. 9 and equation (1) of the strength of the electromagnetic wave, that is far by a largest distance d 10 from the current loop (center) which is a radiated noise source and be on the side of the front plate (76 in FIG. 7) opposite to the backboard (72) which is on the noise source side.

It is important to radio-frequency connect the communication lines (78 in FIG. 7) to the side of the front plate (76 in FIG. 7) in which the radiated noise energy is least by fastening (e.g.,screwing) them in order not to radiate noise due to the communication lines functioning as antennae.

If the communication line is accidentally screw-fastened to the housing side close to the backboard having a high radiated noise energy of the housing, the communication line would serve as an antenna for radiating electromagnetic waves. An embodiment of the present invention will be described in more detail.

DETAILED DESCRIPTION OF THE EMBODIMENTS

FIG. 6 is a view showing the appearance of an apparatus of one embodiment of the present invention. Communication circuit function packages (referred to as "package") having metallic front plates 63 are fastened to the housing 61 by screws. The communication function packages having the metallic front plates 62 are provided with connectors 63 for connecting the packages to external indoor wirings 64.

Figure 7:
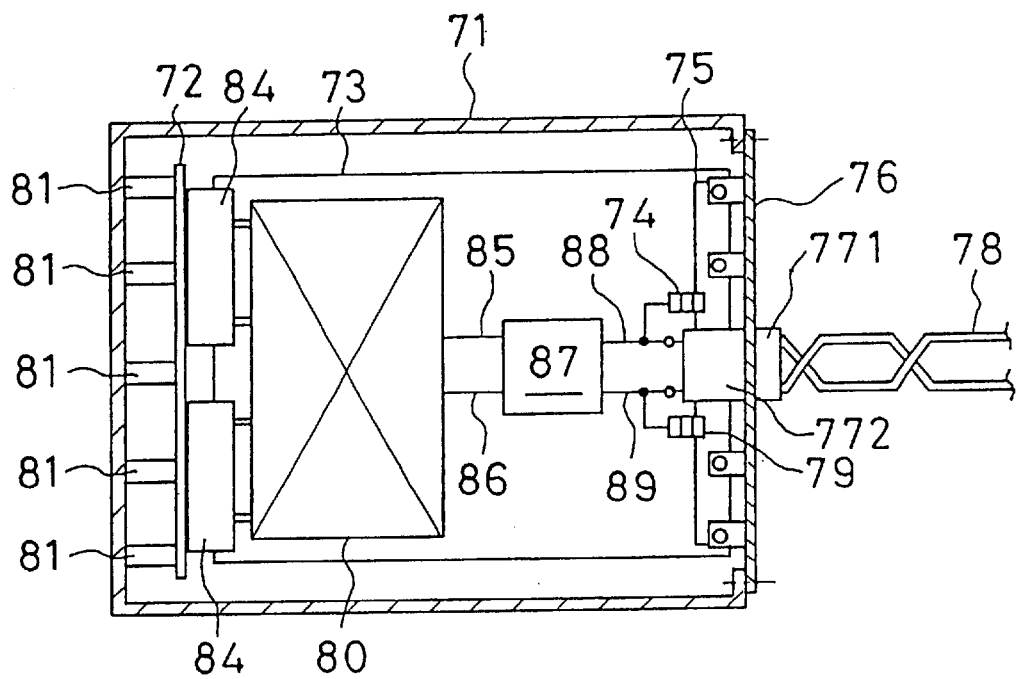
FIG. 7 is a sectional view taken along the line A—A in FIG. 6.

FIG. 7 is an elevational and sectional view taken along a line A—A as viewed in an arrow in FIG. 6. In FIG. 7, the E (earth) of the back board (BWB) 72 is electrically connected to the studs 81 of the metallic housing 71 by means of screws. The communication line circuit function packages 73 are inserted into the connector 84 of the back board 72.

A metallic front plate 76 is disposed in the side opposite to the back board 72 of the communication line circuit function package 73. The metallic front plate 76 is electrically connected to the housing 71 by means of screws and also electrically connected to a solid wired pattern 75 in the package.

Communication wiring patterns 85, 86 lead from a communication line circuit block 80 on which an integrated circuit component such as LSI which is a noise source is mounted in the vicinity of the back board 72 of the communication line circuit function package 73 and in which the radiated noise energy is reduced by decreasing S, I and f in the formula (1) and increasing d.

If the common mode noise energy of the communication lines 85 and 86 is high, a common mode choke coil 87 is inserted between the communication lines 85 and 86, and between 86 and 89.

The communication line 88 is connected to a connector 722 and one end of the capacitor 74 having high frequency (radio-frequency) characteristics. The communication line 89 is connected to a connector 772 and one end of the capacitor 79 having radio-frequency characteristics. Both of capacitors 74 and 79 are electrically connected at the other ends thereof to the solid wired pattern 75.

The twisted pair of indoor communication lines 78 is inserted into the connector 772 which is mounted on the package 73 by means of the connector 771.

Another embodiment of the present invention will be described. In accordance with the present invention, the pseudo-ground is an earth 103 of the package 102 in the above-mentioned metallic housing as well as a molded (plastic) housing 101 as shown in FIG. 10. The earth 103 of the package in which protection against EMI is achieved until the radiated noise energy from the earth 103 of the package 102 becomes not higher than EMI restricted value can be regarded as the pseudoground.

The distribution of the noise energy is not uniform, but in a spotted pattern also in the earth 103 of the package 102 which is the pseudoground. The radiated noise energy is minimal at the position where d in the electromagnetic wave formula (1) is high, that is at the position where the distance from the radiated noise source 104 such as LSI, etc. is furthest. It is the position (side) 109 in FIG. 10 where the communication line can be stably led out.

A phrase "pseudogrounded earth" means a position (part or area) 109 in which the radiated noise energy is minimal In this position, the pseudogrounded earth is radio-frequency connected to communication lines 110A, 110B through the capacitors 106A, 106B, respectively, having radio-frequency characteristics.

In other words, even in the molded housing, the earth (E) of the package is only required to be connected to the communication line at a given position in which the radiated noise energy is minimized.

Although a capacitor having radio-frequency characteristics is used as means for connecting the communication line with the pseudoground which is essential for pseudogrounding in the above-mentioned embodiment, it is to be noted that the present invention is not limited to such a structure.

For example, the capacitor may be formed by a distributed capacitance formed by a pattern wiring technique which requires to consider no break-down voltage as shown in FIGS. 11(a) and 11(b). In this case, a cheaper protection against EMI can be achieved.

Referring now to FIGS. 11(a) and 11(b), the communication line 115 is connected to the indoor communication line 114 via the connector 113. Since a two-layered printed board is assumed, first and second layers comprise a pattern wiring of the communication line 115 and a solid wired pattern 112 which is connected to an earth (E) position of the pseudogrounded metallic housing or molded housing, respectively.

Radio-frequency connection between the communication pattern 115 and the solid wired pattern 112 can be achieved by the distributed capacitance (i.e., interlayer capacitance) formed by the thickness of the two-layered substrate or the interlayer thickness of the multiple-layered substrate.

Since radio-frequency connection for pseudogrounding can be achieved by a capacitor of 5 pF or less and deterioration of the device function performance for protection against EMI should be avoided, a capacitor having a capacitance of 5 pF to 10 pF is generally used. Accordingly, radio-frequency connection using distributed capacitance can be conducted by providing upper and lower layers having a thickness of several micrometers between layers of a PWB, with a communication line and pseudogrounding layer, respectively, by a pattern design technique.

The meritorious effects of the present invention are summarized as follows.

As mentioned above, all plural communication lines, interface lines and power supply lines can be pseudo-grounded by radio-frequency connecting the communication lines, interface lines and power supply lines to a pseudo-grounded housing in accordance with the present invention. Therefore, distinct advantages are obtained that no electromagnetic waves exceeding the EMI restricted value are radiated and that economical, excellent and stable protection against EMI can be achieved.

In other words, in accordance with the present invention a stable protection against EMI can be achieved only by subjecting communication devices in building to the inventive pseudo-grounding without necessity of adopting any expensive ferrite core, shielded cables and working of standard communication lines (non-shielded telephone lines, interface lines, power supply lines which can not be shielded for the reason of safety standards) which are wired indoors simultaneously with the construction of building. The practical value of the present invention is very high.

It should be noted that other objects of the present invention will become apparent in the entire disclosure and that modifications may be done without departing the gist and scope of the present invention as disclosed herein and appended herewith.

Also it should be noted that any combination of the disclosed and/or claimed elements, matters and/or items may fall under the modifications aforementioned.

What is claimed is:

1. A method of protecting against electromagnetic interference (EMI) wherein a wiring is pseudogrounded by radio-frequency, the method comprising:
    (a) providing a wiring for communication;
    (b) providing a housing;
    (c) connecting said wiring having a level of the radiated noise energy which is reduced less than that of a pseudogrounded housing to said housing via a capacitance.

2. A method of protecting against electromagnetic interference (EMI) the method comprising:
    (a) providing a wiring for communication;
    (b) providing a pseudgrounded housing;
        wherein the wiring is pseudogrounded by making the level of the radiated noise energy of a package which is accommodated in the pseduogrounded housing less than that of said housing;
    (c) connecting said wiring connected to a circuit block on said package; and
    (d) connecting to an external wiring via a connector to said pseduogrounded housing via a capacitive element.

3. A method of protecting against electromagnetic interference (EMI), the method comprising:
    (a) providing a wiring for communication;
    (b) providing a pseudogrounded housing;
        wherein the wiring is pseudogrounded by connecting said wiring to a circuit block in a package accommodated in the pseudogrounded housing; and connected to an external wiring via a connector to a given pseudogrounded earth position on said package via a capacitive element.

4. A method of protecting against electromagnetic interference (EMI) for a package having a substrate which is accommodated in a housing, said method comprising:
    providing a writing pattern layer which is connected to a circuit block and is connected to an external wiring via a connector; and
    providing a pattern layer which is connected to a pseudo-grounded position on said package; and
    wherein wiring pattern is pseduogrounded by connecting said wiring pattern layer to said pseudo-grounded position via an interlayer capacitance.

5. A method of protecting against electromagnetic interference (EMI), the method comprising:
   (a) providing a wiring for communication;
   (b) providing a pseudogrounded housing;
      wherein the wiring is pseudogrounded by connecting said wiring to an integrated circuit block of a package to be accommodated in a housing and connected to an external wiring via a connector to said pseudogrounded housing via a capacitance; and
      equalizing the radiated noise energy of said package which is protected against EMI so that the radiated noise energy is not higher than the radiated noise energy of said pseduogrounded housing to the radiated noise energy of said pseudogrounded housing via said capacitance.

6. A structure for protecting an electronic device against electromagnetic interference (EMI), comprising:
   a wiring which is connected to an integrated circuit block;
   a package to be accommodated in a housing,
   wherein the package is connected to an wiring external to said package via a connector is connected to a pseudo-grounded housing via a capacitive element is said package.

7. A structure for protecting an electronic device against EMI as defined in claim 6 wherein said wiring in said package is connected to said integrated circuit block via a choke coil.

8. A structure for protecting an electronic device against electromagnetic interference (EMI), comprising:
   a wiring which is connected to an integrated circuit block;
   a package to be accommodated in a molded housing,
   wherein the package is connected to an wiring external to said package via a connector that is connected to a pseudogrounded earth position via a capacitive element in said package.

9. A structure for protecting an electronic device against EMI as defined in claim 8 wherein said wiring in said package is connected to said integrated circuit block via a choke coil.

10. A structure for protecting an electronic device against electromagnetic interference (EMI) wherein said structure has a plurality of wiring layers, said layers comprising:
   a wiring pattern layer coupled to a package which is connected to a wiring external to the package via a connector, and
   a solid wired pattern layer which is electrically connected to a pseduogrounded metallic housing or a pseudo-grounded position of a molded housing, and in that said wiring pattern is connected to said pseudogrounded position.

11. A structure for protecting an electronic device against EMI as defined in claim 10 wherein said wiring in said package is connected to said integrated circuit block via a choke coil.

12. An electronic device comprising:
   a grounded backboard which contains a package that is electrically connected to an electrically conductive housing;
   wherein the level of the radiated noise energy in said package is less than that of said housing which is reduced less than the level of an electromagnetic interference (EMI) value;
   said package having an electrically conductive front plate which is fastened to said housing on the side opposite to said backboard by means of an electrically conductive fastening means that is connected to a wiring external to the package via a connector and said front plate is electrically connected to a wiring pattern in said package; and
   a wiring pair leads from an integrating circuit device mounted on said package and is connected to a common mode choke coil and said wiring pair is electrically connected between said common mode choke coil and said connector to said solid wired pattern via a capacitive element.

13. The electronic device as defined in claim 12 wherein said external wiring comprises at least a pair of twisted wiring.

14. The electronic device as defined in claim 12 wherein said wiring pair leads further comprise a plurality of lead lines, and each of lead lines is high-frequency connected to said solid wired pattern via said capacitive element.

15. The electronic device as defined in claim 12, wherein said capacitive element comprises an interlayer capacitance of high-frequency characteristics.

* * * * *